(12) United States Patent
Yano et al.

(10) Patent No.: US 9,753,100 B2
(45) Date of Patent: Sep. 5, 2017

(54) MAGNETIC SENSOR

(71) Applicants: DENSO CORPORATION, Kariya, Aichi-pref. (JP); TOHOKU UNIVERSITY, Sendai-shi, Miyagi (JP)

(72) Inventors: Toshifumi Yano, Kariya (JP); Kenichi Ao, Kariya (JP); Takamoto Furuichi, Kariya (JP); Yasuo Ando, Sendai (JP); Mikihiko Oogane, Sendai (JP); Takafumi Nakano, Sendai (JP)

(73) Assignees: DENSO CORPORATION, Kariya (JP); TOHOKU UNIVERSITY, Sendai-shi, Miyagi (JP)

(*) Notice: Subject to any disclaimer, the term of this patent is extended or adjusted under 35 U.S.C. 154(b) by 0 days.

(21) Appl. No.: 15/113,915

(22) PCT Filed: Feb. 23, 2015

(86) PCT No.: PCT/JP2015/000853
§ 371 (c)(1),
(2) Date: Jul. 25, 2016

(87) PCT Pub. No.: WO2015/129235
PCT Pub. Date: Sep. 3, 2015

(65) Prior Publication Data
US 2016/0341801 A1 Nov. 24, 2016

(30) Foreign Application Priority Data

Feb. 26, 2014 (JP) .................................. 2014-035811

(51) Int. Cl.
*H01L 43/02* (2006.01)
*G01R 33/09* (2006.01)
(Continued)

(52) U.S. Cl.
CPC .............. *G01R 33/09* (2013.01); *H01L 43/02* (2013.01); *H01L 43/08* (2013.01); *H01L 43/10* (2013.01)

(58) Field of Classification Search
CPC ......... G01R 33/09; H01L 43/08; H01L 43/10; H01L 43/02
See application file for complete search history.

(56) References Cited

U.S. PATENT DOCUMENTS 8,131,249 B2 * 3/2012 Maehara ................. H01L 43/08
455/318
2003/0184925 A1 10/2003 Hasegawa et al.
(Continued)

FOREIGN PATENT DOCUMENTS

JP 2000-058321 A 2/2000
JP 2002-232039 A 8/2002
(Continued)

*Primary Examiner* — Long Pham
(74) *Attorney, Agent, or Firm* — Posz Law Group, PLC

(57) ABSTRACT

A magnetic sensor includes a magnetization fixed layer, a magnetic field detecting layer, and an intermediate layer. The magnetization fixed layer is formed into a thin-film shape, and a magnetization direction of the magnetization fixed layer is fixed in a direction parallel to an in-plane direction. A magnetization direction of the magnetic field detecting layer changes depending on an external magnetic field. The intermediate layer is disposed between the magnetization fixed layer and the magnetic field detecting layer, and a resistance value of the intermediate layer changes depending on an angle between the magnetization direction of the magnetization fixed layer and the magnetization direction of the magnetic field detecting layer. A magnetization amount per unit area of the magnetic field detecting layer is less than 0.2 [memu/cm$^2$].

7 Claims, 3 Drawing Sheets

(51) Int. Cl.
*H01L 43/08* (2006.01)
*H01L 43/10* (2006.01)

(56) References Cited

U.S. PATENT DOCUMENTS

| | | |
|---|---|---|
| 2003/0197987 A1 | 10/2003 | Saito |
| 2008/0211490 A1 | 9/2008 | Kurata et al. |
| 2014/0241138 A1* | 8/2014 | Hirata .................. G11B 5/3133 369/13.33 |

FOREIGN PATENT DOCUMENTS

| | | |
|---|---|---|
| JP | 2004-006494 A | 1/2004 |
| JP | 2006-066821 A | 3/2006 |

* cited by examiner

MAGNETIC SENSOR

CROSS REFERENCE TO RELATED APPLICATIONS

The present disclosure is a U.S. national stage application of International Patent Application No. PCT/JP2015/000853 filed on Feb. 23, 2015 and is based on Japanese Patent Application No. 2014-35811 filed on Feb. 26, 2014, the disclosure of which is incorporated herein by reference.

TECHNICAL FIELD

The present disclosure relates to a magnetic sensor.

BACKGROUND

In a conventional magnetic sensor, a magnetic resistance effect film including a fixed layer P, a spacer S, and a free layer F and a bias magnet film that applies a bias magnetic field to the free layer are disposed on the same substrate (see, for example, Patent Literature 1).

In the magnetic sensor, a magnetization direction of the free layer F is stably restored to an initial state by the bias magnetic field applied from the bias magnet film to the free layer so that a detected magnetic field range of an external magnetic field can be enlarged as the magnetic sensor.

However, the actual detected magnetic field range of the magnetic sensor in Patent Literature 1 is only about 2 [mT] (i.e., 20 [Oe]), and the magnetic sensor cannot deal with the larger detected magnetic field range.

PATENT LITERATURE

Patent Literature 1: JP2006-66821A

SUMMARY

An object of the present disclosure is to provide a magnetic sensor having a large detected magnetic field range of an external magnetic field.

A magnetic sensor according an aspect of the present disclosure includes a magnetization fixed layer, a magnetic field detecting layer, and an intermediate layer. The magnetization fixed layer is formed into a thin-film shape and has a magnetization direction fixed to a direction parallel to an in-plane direction. The magnetic field detecting layer has a magnetization direction that changes depending on an external magnetic field. The intermediate layer is disposed between the magnetization fixed layer and the magnetic field detecting layer and has a resistance value that changes depending on an angle between the magnetization direction of the magnetization fixed layer and the magnetization direction of the magnetic field detecting layer. A magnetization amount per unit area of the magnetic field detecting layer is less than 0.2 [memu/cm$^2$].

The magnetic sensor can have a large detected magnetic field range of the external magnetic field.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

The following describes a magnetic sensor 1 according to an embodiment of the present disclosure with reference to the drawings.

Figure 1:
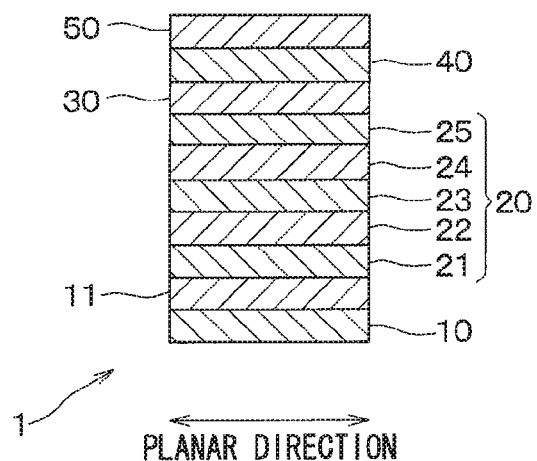
FIG. 1 is a diagram showing a cross-sectional structure of a magnetic sensor according to an embodiment of the present disclosure.

The magnetic sensor 1 according to the present embodiment includes a substrate 10, a thermal oxidation film 11, a pin layer 20, an intermediate layer 30, a free layer 40, and a protective layer 50, as shown in FIG. 1.

The substrate 10 is a substrate made of a Si wafer (silicon wafer). The thermal oxidation film 11 is made of SiO$_2$ and formed into a thin-film shape on the substrate 10. The pin layer 20 includes a base layer 11, an antiferromagnetic layer 22, a ferromagnetic layer 23, a nonmagnetic layer 24, and a ferromagnetic layer 25. The pin layer 20 corresponds to a magnetization fixed layer.

The base layer 21 is made of, for example, Ta or Ru and is formed into a thin-film shape on the thermal oxidation film 11. The antiferromagnetic layer 22 is made of, for example, IrMn or PtMn, and is formed into a thin-film shape on the base layer 21. A magnetization direction of the antiferromagnetic layer 22 (i.e., a magnetization direction of the pin layer 20) is fixed to a predetermined direction. The magnetization direction of the antiferromagnetic layer 22 is parallel to an in-plane direction of the antiferromagnetic layer 22 (i.e., the substrate 10). The in-plane direction means a planar direction in which the antiferromagnetic layer 22 (i.e., the substrate 10) spreads flatly.

The ferromagnetic layer 23 is made of an alloy including Co, Fe, and Ni, and is formed into a thin-film shape on the antiferromagnetic layer 22. The nonmagnetic layer 24 is made of, for example, Ru, and is formed into a thin-film shape on the ferromagnetic layer 23. The ferromagnetic layer 25 is made of an alloy including Co, Fe, Ni, and B, and is formed into a thin-film shape on the ferromagnetic layer 25. The ferromagnetic layer 23, the nonmagnetic layer 24 and the ferromagnetic layer 25 interrupts the magnetic field from the antiferromagnetic layer 22 from leaking to the free layer 40.

The intermediate layer 30 is formed into a thin-film shape on the antiferromagnetic layer 25. In a case where the intermediate layer 30 is formed of an insulation layer made of, for example, MgO or AlO, a tunnel magneto resistance effect (TMR) element is formed as the magnetic sensor 1. On the other hand, in a case where the intermediate layer 30 is formed of a non-ferromagnetic layer made of, for example, Cu or Ag, a giant magneto resistance (GMR) element is formed as the magnetic sensor 1.

The free layer 40 is formed into a thin-film shape on the intermediate layer 30. The free layer 40 forms a magnetic field detecting layer having a magnetization direction that changes depending on an external magnetic field. The free layer 40 according to the present embodiment is a CoFeB film made of an alloy including Co, Fe, and B. The protective film 50 is made of, for example, Ta or Ru, and is formed into a thin-film shape on the free layer 40.

A state of the CoFeB film forming the free layer 40 according to the present embodiment may be crystal or amorphous.

In the magnetic sensor 1 according to the present embodiment having the above-described structure, the substrate 10, the pin layer 20, the intermediate layer 30, and the free layer 40 are formed in parallel with each other. An electric resistance value of the pin layer 20 and the free layer 40 via the intermediate layer 30 (hereafter, referred to as a resistance value of the magnetic sensor 1) changes depending on an intensity of the external magnetic field.

Next, an operation of the magnetic sensor 1 according to the present embodiment will be described with reference to FIG. 2A to FIG. 2D.

Figure 2A:
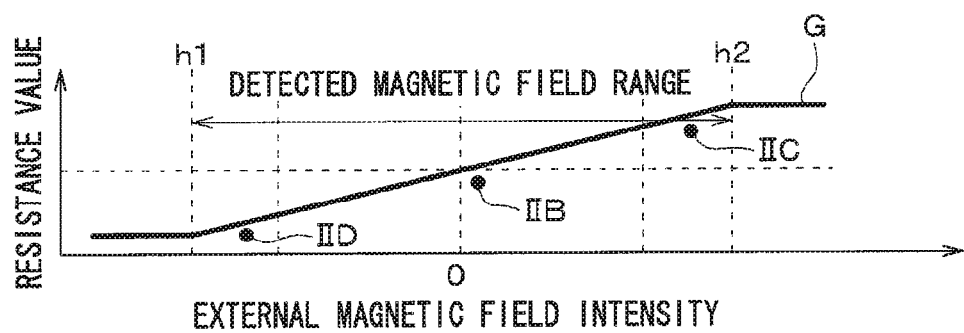
FIG. 2A is a diagram showing a relationship between an external magnetic field intensity and a resistance value of the magnetic sensor.
Figure 2B:
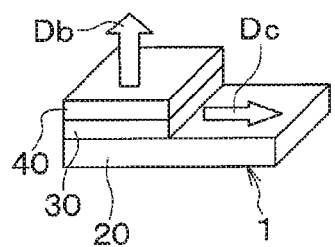
FIG. 2B is a diagram showing a magnetization direction of a free layer and a magnetization direction of a pin layer in a case where the external magnetic field intensity is 0.
Figure 2C:
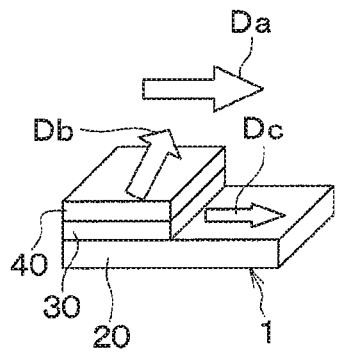
FIG. 2C is a diagram showing the magnetization direction of the free layer in a case where the external magnetic field is applied to the magnetic sensor in a direction same as the magnetization direction of the pin layer.
Figure 2D:
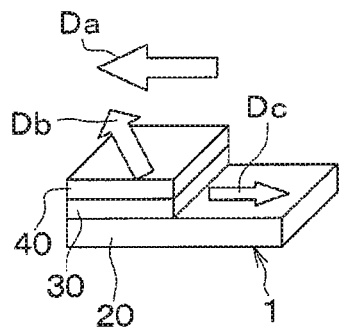
FIG. 2D is a diagram showing the magnetization direction of the free layer in a case where the external magnetic field is applied to the magnetic sensor in a direction opposite to the magnetization direction of the pin layer.

FIG. 2A is a graph G in which a vertical axis is the resistance value of the magnetic sensor 1 and a horizontal axis is the external magnetic field intensity. In FIG. 2A, a center of the horizontal axis is a reference point at which the external magnetic field intensity is 0 (zero). In FIG. 2B, FIG. 2C, FIG. 2D, arrows Da are directions of the external magnetic field, arrows Db are magnetization directions of the free layer 40, and arrows Dc are magnetization directions of the pin layer 20.

As shown in FIG. 2B, when the external magnetic field intensity is 0 (zero) (corresponding to IIB in FIG. 2A), the magnetization direction Db of the free layer 40 is a direction perpendicular to the in-plane direction of the free layer 40.

As shown in FIG. 2C, in a case where the external magnetic field is applied to the magnetic sensor 1 in a direction same as the magnetization direction Dc of the pin layer 20, the magnetization direction of the free layer 40 changes and an angle between the magnetization direction of the free layer 40 and the magnetization direction of the pin layer 20 decreases with increase of the external magnetic field intensity. In this case, the resistance value of the magnetic sensor 1 increases with increase of the external magnetic field intensity.

As shown in FIG. 2D, in a case where the external magnetic field is applied to the magnetic sensor 1 in a direction opposite to the magnetization direction Dc of the pin layer 20 (corresponding to IID in FIG. 2A), the magnetization direction of the free layer 40 changes and the angle between the magnetization direction of the free layer 40 and the magnetization direction of the pin layer 20 increases with increase of the external magnetic field intensity. In this case, the resistance value of the magnetic sensor 1 decreases with increase of the external magnetic field intensity.

As described above, the graph G in FIG. 2A according to the present disclosure has inflection points h1 and h2, and the resistance value of the magnetic sensor 1 increases with increase of the external magnetic field intensity between the inflection points h1 and h2. A range of the external magnetic field intensity between the inflection points h1 and h2 is defined as a detected magnetic field range of the magnetic sensor 1.

The inventors carried out a verification experiment of the magnetic sensor 1 so as to obtain a large detected magnetic field range as the detected magnetic field range of the magnetic sensor 1. The following describes results of the verification experiment of the magnetic sensor 1 with reference to FIG. 3A, FIG. 3B, and FIG. 3C.

The verification experiment is an experiment in which a relationship between the magnetization amount per unit area of the free layer 40 and the detected magnetic field range of the magnetic sensor 1 is examined.

Figure 3A:
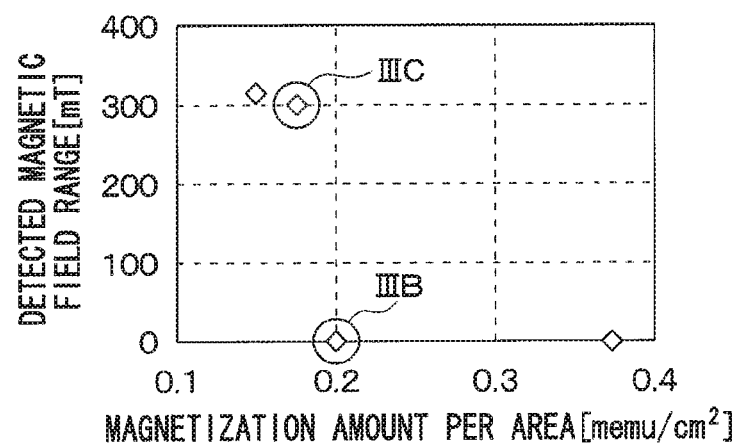
FIG. 3A is a diagram showing a relationship between a magnetization amount per unit area of the magnetic sensor and a detected magnetic field range.
Figure 3B:
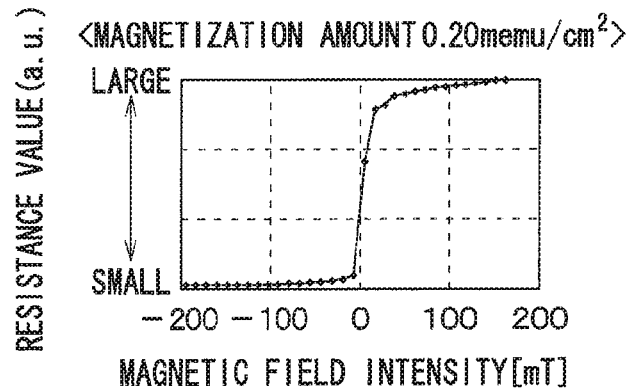
FIG. 3B is a diagram showing an experimental result that the detected magnetic field range of the magnetic sensor is about 0 [mT] when the magnetization amount per unit area of the free layer is set to 0.20 [memu/cm$^2$]
Figure 3C:
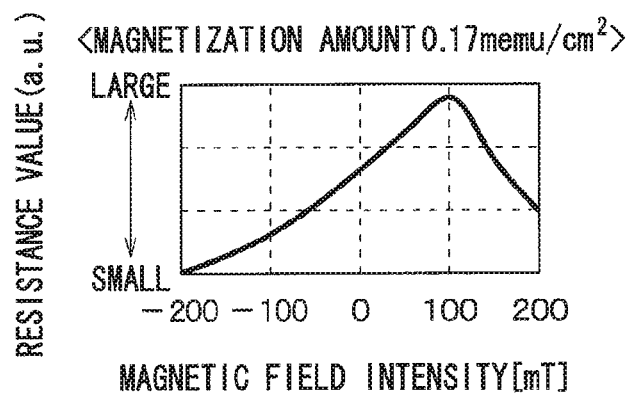
FIG. 3C is a diagram showing an experimental result that the detected magnetic field range of the magnetic sensor is 300 [mT] when the magnetization amount per unit area of the free layer is set to 0.17 [memu/cm$^2$]

Each of four diamond-shaped plots in FIG. 3A is the result of the verification experiment showing the relationship between the magnetization amount per unit area of the free layer 40 and the detected magnetic field range of the magnetic sensor 1. The four diamond-shaped plots are the results of the verification experiment in cases where the magnetization amounts per unit area of the free layer 40 are set to be different values. FIG. 3B shows the experimental result that the detected magnetic field range of the magnetic sensor 1 is about 0 [mT] when the magnetization amount per unit area of the free layer 40 is set to 0.20 [memu/cm$^2$] (corresponding to IIIB in FIG. 3A). FIG. 3C shows the experimental result that the detected magnetic field range of the magnetic sensor 1 is 300 [mT] when the magnetization amount per unit area of the free layer 40 is set to 0.17 [memu/cm$^2$] (corresponding to IIIC in FIG. 3A). The detected magnetic field range in FIG. 3C has the minimum value of −200 [mT] and the maximum value of 100 [mT]. Thus, as known from the four plots in FIG. 3A, FIG. 3B, and FIG. 3C, when the magnetization amount per unit area of the free layer 40 is less than 0.2 [memu/cm$^2$], the detected magnetic field range of the magnetic sensor 1 is 300 [mT] or more. The magnetization amount per unit area of the free layer 40 is a magnitude of a magnetic moment per unit area of the free layer 40.

Thus, in the magnetic sensor 1 according to the present embodiment, the magnetization amount per unit area of the free layer 40 is set to a value greater than 0 [memu/cm$^2$] and less than 0.2 [memu/cm$^2$].

Figure 4:
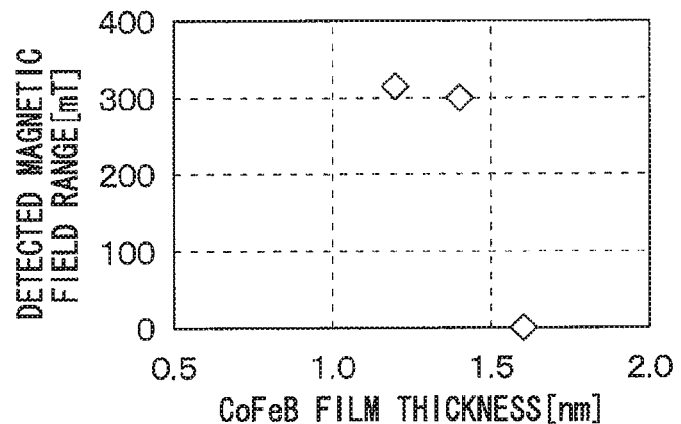
FIG. 4 is a diagram showing a relationship between a thickness of the free layer (CoFeB film) and the detected magnetic field range of the magnetic sensor.

Furthermore, according to the verification experiment, as shown in FIG. 4, the magnetization amount per unit area of the free layer 40 decreases and the detected magnetic field range enlarges with decrease of the thickness of the free layer 40 (CoFeB film thickness in the drawing). Thus, in the present embodiment, the detected magnetic field range of 300 [mT] or more is set in the magnetic sensor 1 by setting the thickness of the free layer 40 to be less than about 1.5 [nm]. Three diamond-shaped plots in FIG. 4 indicate the detected magnetic field ranges of the magnetic sensor 1 when the thickness of the free layer 40 is set to be different values.

According to the present embodiment described above, the magnetic sensor 1 includes the pin layer 20 having the magnetization direction that is fixed with respect to the external magnetic field, the free layer 40 having the magnetization direction that changes depending on the external magnetic field, and the intermediate layer 30 disposed between the pin layer 20 and the free layer 40 and having the resistance value that changes depending on the angle between the magnetization direction of the pin layer 20 and the magnetization direction of the free layer 40. The magnetization amount per unit area of the free layer 40 is less than 0.2 [memu/cm$^2$] (=0.2×10$^{-3}$ [emu/cm$^2$]). Accordingly, a large detected magnetic field range of 300 [mT] or more can be set in the magnetic sensor 1.

In the magnetic sensor 1, the magnetization amount per unit area of the free layer 30 is defined to be less than 0.2 [memu/cm$^2$]. The value defining the magnetization amount is the same even when the material or the crystal state of the free layer 40, or the pin layer 20 or the intermediate layer 30 is changed into the above-described contents. That is, in the magnetic sensor 1, when the magnetization amount per unit area of the free layer 40 is defined to be less than 0.2 [memu/cm$^2$], the large detected magnetic field range of 300 [mT] or more can be set without depending on the material or the crystal state of the free layer 40, or the pin layer 20 or the intermediate layer 30.

Other Embodiments

In the above-described embodiment, an example that the free layer 40 is composed of the CoFeB film is described. However, the free layer 40 is not limited to that and may be composed of something other than the CoFeB film. Furthermore, the pin layer 20 or the intermediate layer 30 may be composed of a something other than the above-described material.

In the above-described embodiment, the example that the free layer 40 is composed of the CoFeB film is described. Alternatively, the free layer 40 may be composed of at least one or more elements among Co, Fe, and Ni. In this case, the free layer 40 may be composed of an alloy including at least one or more elements among Co, Fe, and Ni, and B.

In the above-described embodiment, an example that the magnetization amount per unit area of the free layer 40 is decreased by decreasing the thickness of the free layer 40. Alternatively, the magnetization amount per unit area of the free layer 40 may be decreased by increasing the content of a nonmagnetic material in the free layer 40. In this case, the detected magnetic field range of the magnetic sensor 1 can be enlarged by adjusting the content of the nonmagnetic material in the free layer 40.

The present disclosure is not limited to the above-described embodiments and may be suitably modified.

The invention claimed is:

1. A magnetic sensor comprising:
   a magnetization fixed layer formed into a thin-film shape and having a magnetization direction fixed to a direction parallel to an in-plane direction;
   a magnetic field detecting layer having a magnetization direction that changes depending on an external magnetic field; and
   an intermediate layer disposed between the magnetization fixed layer and the magnetic field detecting layer and having a resistance value that changes depending on an angle between the magnetization direction of the magnetization fixed layer and the magnetization direction of the magnetic field detecting layer, wherein
   a magnetization amount per unit area of the magnetic field detecting layer is less than 0.2 [memu/cm$^2$].

2. The magnetic sensor according to claim 1, wherein the magnetic field detecting layer includes at least one or more elements among Co, Fe, and Ni.

3. The magnetic sensor according to claim 2, wherein the magnetic field detecting layer includes B.

4. The magnetic sensor according to claim 1, wherein the magnetic field detecting layer is a CoFeB film that is made by forming an alloy including Co, Fe, and B into a film shape.

5. The magnetic sensor according to claim 1, wherein the magnetization amount per unit area of the magnetic field detecting layer is configured to be less than 0.2 memu/cm$^2$ to detect an external magnetic field in a detected magnetic field range of 300 mT or more.

6. The magnetic sensor according to claim 1, wherein the magnetization amount per unit area of the magnetic field detecting layer is configured to be less than 0.2 memu/cm$^2$ to detect an external magnetic field in a detected magnetic field range of 300 mT or more without depending on a material or a crystal state of the magnetic field detecting layer, the insulating layer, or the magnetization fixed layer.

7. The magnetic sensor according to claim 1, wherein the magnetic field detecting layer has a thickness of 1.5 nm or less.

* * * * *